United States Patent
Faibish et al.

(10) Patent No.: US 10,503,516 B1
(45) Date of Patent: Dec. 10, 2019

(54) CONCURRENT DATA ENTROPY AND DIGEST COMPUTATION OPERATING ON SAME DATA FOR CPU CACHE EFFICIENCY

(71) Applicant: EMC IP Holding Company LLC, Hopkinton, MA (US)

(72) Inventors: Sorin Faibish, Newton, MA (US); Ivan Bassov, Brookline, MA (US); Rustem Rafikov, Hopkinton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/043,640

(22) Filed: Jul. 24, 2018

(51) Int. Cl.
| | |
|---|---|
| *H03M 7/00* | (2006.01) |
| *G06F 9/38* | (2018.01) |
| *G06F 12/0831* | (2016.01) |
| *G06F 3/06* | (2006.01) |
| *G06F 16/178* | (2019.01) |
| *G06F 16/17* | (2019.01) |

(52) U.S. Cl.
CPC ........ *G06F 9/3869* (2013.01); *G06F 12/0835* (2013.01); *G06F 3/0638* (2013.01); *G06F 3/0641* (2013.01); *G06F 16/178* (2019.01); *G06F 16/1734* (2019.01); *G06F 2212/1044* (2013.01); *H03M 7/00* (2013.01)

(58) Field of Classification Search
CPC .... H03M 7/00; G06F 16/178; G06F 16/1734; G06F 3/0641; G06F 3/0638
USPC .................. 341/50; 707/637, 625, 692, 693; 711/162, 113, 170
See application file for complete search history.

(56) References Cited

U.S. PATENT DOCUMENTS

2018/0349053 A1* 12/2018 Battaje .................. G06F 3/0641

OTHER PUBLICATIONS

ForensickB, "Computer Forensics, Malware Analysis & Digital Investigations," http://www.forensickb.com/2013/03/file-entropy-explained.html, Mar. 20, 2013.
Wikipedia, "Entropy (information theory)," https://en.wikipedia.org/wiki/entropy_(information_theory), Sep. 9, 2018.
(Continued)

*Primary Examiner* — Joseph J Lauture
(74) *Attorney, Agent, or Firm* — Muirhead and Saturnelli, LLC

(57) ABSTRACT

Techniques for CPU cache efficiency may include performing concurrent processing, such as for first and second data operations, in a synchronized manner that prevents loading the same data chunk into the CPU cache more than once. Processing may include synchronizing the first and second data operations with respect to a first data chunk to ensure that both complete prior to proceeding with performing such processing on a second data chunk. The first and second data operations for a chunk may be deduplication digest computation and entropy computation performed inline as part of the data path. If the chunk cannot be deduplicated, the entropy value may be used with an adaptive entropy threshold to determine whether to compress the chunk inline. The entropy value may be determined using less than all bytes in the chunk. The chunk's entropy value may be determined based on a data set entropy value.

20 Claims, 11 Drawing Sheets

(56) References Cited

OTHER PUBLICATIONS

Werner Ebeling, et al., "Entropy and Compressibility of Symbol Sequences," PhysComp96, Institute of Physics, Humboldt University, Feb. 23, 1997.
Kedarnath J. Balakrishnan, "Relationship Between Entropy and Test Data Compression," IEEE Transactions on Computer-Aided Design of Integrated Circuits and Systems, vol. 26, No. 2, Feb. 2007.

* cited by examiner

CONCURRENT DATA ENTROPY AND DIGEST COMPUTATION OPERATING ON SAME DATA FOR CPU CACHE EFFICIENCY

BACKGROUND

Technical Field

This application generally relates to performing data computation operations.

Description of Related Art

Systems may include different resources used by one or more host processors. Resources and host processors in the system may be interconnected by one or more communication connections, such as network connections. These resources may include, for example, data storage devices such as those included in the data storage systems manufactured by Dell EMC™. These data storage systems may be coupled to one or more host processors and provide storage services to each host processor. Multiple data storage systems from one or more different vendors may be connected and may provide common data storage for one or more host processors in a computer system.

A host may perform a variety of data processing tasks and operations using the data storage system. For example, a host may issue I/O operations, such as data read and write operations, received at a data storage system. Host systems may store and retrieve data by issuing the I/O operations to the data storage system containing a plurality of host interface units, disk drives (or more generally storage devices), and disk interface units. Such data storage systems are provided, for example, by Dell EMC™. The host systems access the storage devices through a plurality of channels provided therewith. Host systems provide data and access control information through the channels to a storage device of the data storage system and data of the storage device is also provided from the data storage system to the host systems also through the channels. The host systems do not address the disk drives of the data storage system directly, but rather, access what appears to the host systems as a plurality of files, objects, logical units, logical devices or logical volumes. Thus, the I/O operations issued by the host may be directed to a particular storage entity, such as a file or logical device. The logical devices may or may not correspond to the actual physical drives. Allowing multiple host systems to access the single data storage system allows the host systems to share data stored therein.

SUMMARY OF THE INVENTION

In accordance with one aspect of the techniques herein is a method of performing data processing comprising: performing first processing that computes a data deduplication digest for a first data chunk; performing second processing that computes an entropy value for the first data chunk; and synchronizing the first processing and the second processing with respect to the first data chunk, wherein said synchronizing ensures that both the first processing and the second processing have completed prior to proceeding with performing any of the first processing and the second processing on a second data chunk. The first processing and the second processing for the first data chunk may be performed in parallel. One of the first processing and the second processing may complete processing for the first data chunk prior to another one of the first processing and the second processing, and the synchronizing may not allow the one of the first and second processing to proceed with processing the second data chunk until the another one of the first processing and the second processing has completed its processing for the first data chunk. The first data processing and the second data processing may be performed inline as part of I/O path processing. The method may include: determining, using the data deduplication digest for a first data chunk, whether the first chunk can be deduplicated whereby the first chunk is a duplicate of an existing chunk currently associated with the data deduplication digest; and responsive to determining that the first chunk can be deduplicated, deduplicating the first data chunk. The method may include performing processing responsive to determining that the first chunk cannot be deduplicated, where the processing may include: determining whether the entropy value for the first data chunk is greater than an entropy threshold; responsive to determining that the entropy value for the first data chunk is not greater than the entropy threshold, determining not to compress the first data chunk inline as part of the I/O path; and responsive to determining that the entropy value for the first data chunk is equal to or less than the entropy threshold, compressing the first data chunk inline as part of the I/O path. The first data chunk may be data of a write operation received at a data storage system and the method may include: determining a current workload of the data storage system; and modifying the entropy threshold in accordance with the current workload of the data storage system. The method may include: determining whether the current workload is above a high workload threshold; and responsive to determining the current workload is above the high workload threshold, decreasing the entropy threshold in accordance with the current workload. The method may include: determining whether the current workload is less than a low workload threshold; and responsive to determining the current workload is less than the low workload threshold, increasing the entropy threshold in accordance with the current workload. The entropy value for the first data chunk may be determined using less than all data of the first data chunk. The entropy value for the first data chunk is determined using selected bytes of the first data chunk. The first data chunk may be included in a data set having a data set entropy value and the entropy value for the first data chunk may be determined as the data set entropy value. The data set may include a first plurality of data chunks and the method may include: selecting a second plurality of data chunks of the data set, the second plurality being less than the first plurality of data chunks; determining a plurality of entropy values for the second plurality of data chunks; determining whether the plurality of entropy values are similar to one another; and responsive to determining the plurality of entropy values are similar to one another, determining the data set entropy value in accordance with plurality of entropy values for the second number of data chunks of the data set.

In accordance with another aspect of techniques herein is a system comprising: a processor; and a memory comprising code stored thereon that, when executed, performs a method of performing data processing comprising: performing first processing that computes a data deduplication digest for a first data chunk; performing second processing that computes an entropy value for the first data chunk; and synchronizing the first processing and the second processing with respect to the first data chunk, wherein said synchronizing ensures that both the first processing and the second processing have completed prior to proceeding with performing any of the first processing and the second processing on a second data chunk.

In accordance with another aspect of techniques herein is a computer readable medium comprising code stored thereon that, when executed, performs a method of performing data processing comprising: performing first processing that computes a data deduplication digest for a first data chunk; performing second processing that computes an entropy value for the first data chunk; and synchronizing the first processing and the second processing with respect to the first data chunk, wherein said synchronizing ensures that both the first processing and the second processing have completed prior to proceeding with performing any of the first processing and the second processing on a second data chunk. The first processing and the second processing for the first data chunk may be performed in parallel. One of the first processing and the second processing may complete processing for the first data chunk prior to another one of the first processing and the second processing, and wherein the synchronizing may not allow the one of the first and second processing to proceed with processing the second data chunk until the another one of the first processing and the second processing has completed its processing for the first data chunk. The first data processing and the second data processing may be performed inline as part of I/O path processing. The method may include: determining, using the data deduplication digest for a first data chunk, whether the first chunk can be deduplicated whereby the first chunk is a duplicate of an existing chunk currently associated with the data deduplication digest; and responsive to determining that the first chunk can be deduplicated, deduplicating the first data chunk. The method may include performing processing responsive to determining that the first chunk cannot be deduplicated, and the processing may include: determining whether the entropy value for the first data chunk is greater than an entropy threshold; responsive to determining that the entropy value for the first data chunk is not greater than the entropy threshold, determining not to compress the first data chunk inline as part of the I/O path; and responsive to determining that the entropy value for the first data chunk is equal to or less than the entropy threshold, compressing the first data chunk inline as part of the I/O path.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF
EMBODIMENT(S)

Figure 1:
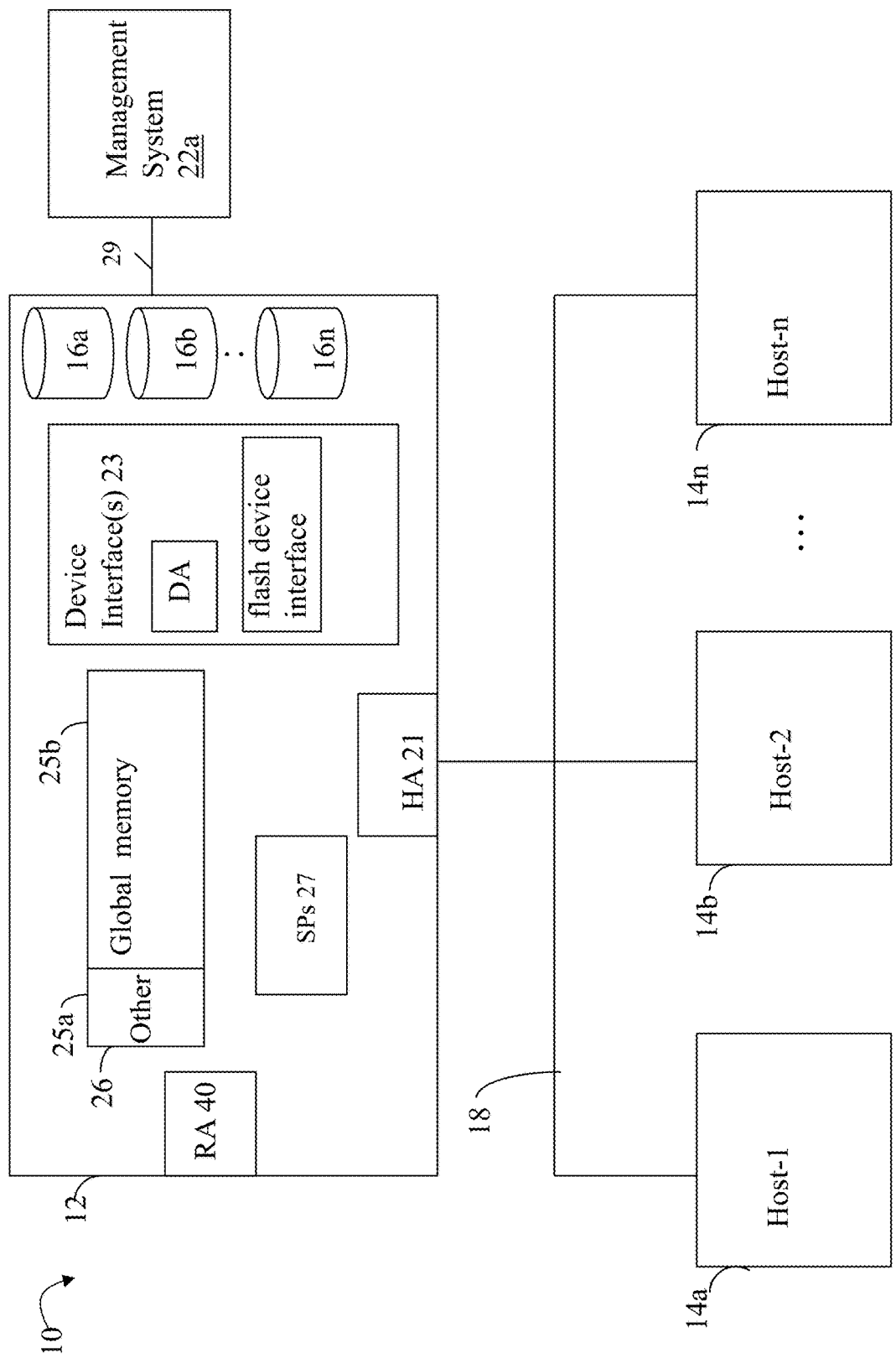
FIGS. 1 and 2B are examples of components that may be included in a system in accordance with techniques described herein.

Referring to FIG. 1, shown is an example of an embodiment of a system that may be used in connection with performing the techniques described herein. The system 10 includes a data storage system 12 connected to host systems 14a-14n through communication medium 18. In this embodiment of the computer system 10, and the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols such as block-based protocols (e.g., SCSI, Fibre Channel, iSCSI), file system-based protocols (e.g., NFS), and the like. Some or all of the connections by which the hosts and data storage system may be connected to the communication medium may pass through other communication devices, such switching equipment that may exist such as a phone line, a repeater, a multiplexer or even a satellite.

Each of the host computer systems may perform different types of data operations in accordance with different types of tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN (storage area network) or LAN (local area network), in an embodiment using the techniques herein. It should also be noted that an embodiment may include data storage arrays or other components from one or more vendors. In subsequent examples illustrated the techniques herein, reference may be made to a single data storage array by a vendor, such as by Dell EMC™. However, as will be appreciated by those skilled in the art, the techniques herein are applicable for use with other data storage arrays by other vendors and with other components than as described herein for purposes of example.

The data storage system 12 may be a data storage appliance or a data storage array including a plurality of data storage devices (PDs) 16a-16n. The data storage devices 16a-16n may include one or more types of data storage devices such as, for example, one or more rotating disk drives and/or one or more solid state drives (SSDs). An SSD is a data storage device that uses solid-state memory to store persistent data. An SSD using SRAM or DRAM, rather than flash memory, may also be referred to as a RAM drive. SSD may refer to solid state electronics devices as distinguished from electromechanical devices, such as hard drives, having moving parts. Flash devices or flash memory-based SSDs are one type of SSD that contains no moving mechanical parts. The flash devices may be constructed using nonvolatile semiconductor NAND flash memory. The flash devices may include one or more SLC (single level cell) devices and/or MLC (multi level cell) devices.

The data storage array may also include different types of adapters or directors, such as an HA 21 (host adapter), RA 40 (remote adapter), and/or device interface 23. Each of the adapters may be implemented using hardware including a processor with local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The HA 21 may be characterized as a front end component of the data storage system which receives a request from the host. The data storage array may include one or more RAs that may be used, for example, to facilitate communications between data storage arrays. The data storage array may also include one or more device interfaces 23 for facilitating data transfers to/from the data storage devices 16a-16n. The data storage interfaces 23 may include device interface modules, for example, one or more disk adapters (DAs) (e.g., disk controllers), adapters used to interface with the flash drives, and the like. The DAs may also be characterized as back end components of the data storage system which interface with the physical data storage devices.

One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, HAs and/or RAs in a data storage array. In one embodiment, the device interfaces 23 may perform data operations using a system cache that may be included in the global memory 25b, for example, when communicating with other device interfaces and other components of the data storage array. The other portion 25a is that portion of memory that may be used in connection with other designations that may vary in accordance with each embodiment.

The particular data storage system as described in this embodiment, or a particular device thereof, such as a disk or particular aspects of a flash device, should not be construed as a limitation. Other types of commercially available data storage systems, as well as processors and hardware controlling access to these particular devices, may also be included in an embodiment.

Host systems provide data and access control information through channels to the storage systems, and the storage systems may also provide data to the host systems also through the channels. The host systems do not address the drives or devices 16a-16n of the storage systems directly, but rather access to data may be provided to one or more host systems from what the host systems view as a plurality of logical devices, logical volumes (LVs) which may also referred to herein as logical units (e.g., LUNs). A logical unit (LUN) may be characterized as a disk array or data storage system reference to an amount of disk space that has been formatted and allocated for use to one or more hosts. A logical unit may have a logical unit number that is an I/O address for the logical unit. As used herein, a LUN or LUNs may refer to the different logical units of storage which may be referenced by such logical unit numbers. The LUNs may or may not correspond to the actual or physical disk drives or more generally physical storage devices. For example, one or more LUNs may reside on a single physical disk drive, data of a single LUN may reside on multiple different physical devices, and the like. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may be one type of device interface used in connection with facilitating data transfers to/from the associated disk drive(s) and LUN (s) residing thereon. A flash device interface may be another type of device interface used in connection with facilitating data transfers to/from the associated flash devices and LUN(s) residing thereon. It should be noted that an embodiment may use the same or a different device interface for one or more different types of devices than as described herein.

In an embodiment in accordance with techniques herein, the data storage system as described may be characterized as having one or more logical mapping layers in which a logical device of the data storage system is exposed to the host whereby the logical device is mapped by such mapping layers of the data storage system to one or more physical devices. Additionally, the host may also have one or more additional mapping layers so that, for example, a host side logical device or volume is mapped to one or more data storage system logical devices as presented to the host.

It should be noted that although examples of techniques herein may be made with respect to a physical data storage system and its physical components (e.g., physical hardware for each HA, DA, HA port and the like), techniques herein may be performed in a physical data storage system including one or more emulated or virtualized components (e.g., emulated or virtualized ports, emulated or virtualized DAs or HAs), and also a virtualized or emulated data storage system including virtualized or emulated components.

Also shown in FIG. 1 is a management system 22a that may be used to manage and monitor the system 12. In one embodiment, the management system 22a may be a computer system which includes data storage system management software or application such as may execute in a web browser. A data storage system manager may, for example, view information about a current data storage configuration such as LUNs, storage pools, and the like, on a user interface (UI) in a display device of the management system 22a. Alternatively, and more generally, the management software may execute on any suitable processor in any suitable system. For example, the data storage system management software may execute on a processor of the data storage system 12.

It should be noted that each of the different adapters, such as HA 21, DA or disk interface, RA, and the like, may be implemented as a hardware component including, for example, one or more processors, one or more forms of memory, and the like. Code may be stored in one or more of the memories of the component for performing processing.

The device interface, such as a DA, performs I/O operations on a physical device or drive 16a-16n. In the following description, data residing on a LUN may be accessed by the device interface following a data request in connection with I/O operations. For example, a host may issue an I/O operation which is received by the HA 21. The I/O operation may identify a target location from which data is read from, or written to, depending on whether the I/O operation is, respectively, a read or a write operation request. The target location of the received I/O operation may be expressed in terms of a LUN and logical address or offset location (e.g., LBA or logical block address) on the LUN. Processing may be performed on the data storage system to further map the target location of the received I/O operation, expressed in terms of a LUN and logical address or offset location on the LUN, to its corresponding physical storage device (PD) and location on the PD. The DA which services the particular PD may further perform processing to either read data from, or write data to, the corresponding physical device location for the I/O operation.

It should be noted that an embodiment of a data storage system may include components having different names from that described herein but which perform functions similar to components as described herein. Additionally, components within a single data storage system, and also between data storage systems, may communicate using any suitable technique that may differ from that as described herein for exemplary purposes. For example, element 12 of FIG. 1 may be a data storage system, such as the Dell EMC Unity® data storage system. that includes multiple storage processors (SPs). Each of the SPs 27 may be a CPU including one or more "cores" or processors and each may have their own memory used for communication between the different front end and back end components rather than utilize a global memory accessible to all storage processors. In such embodiments, memory 26 may represent memory of each such storage processor.

Generally, techniques herein may be used in connection with any suitable storage system, appliance, device, and the like, in which data is stored. For example, an embodiment may implement techniques herein using a midrange data storage system, such as a Dell EMC Unity® data storage system, as well as a high end or enterprise data storage system, such as a Dell EMC™ PowerMAX™ data storage system.

The data path or I/O path may be characterized as the path or flow of I/O data through a system. For example, the data or I/O path may be the logical flow through hardware and software components or layers in connection with a user, such as an application executing on a host (e.g., more generally, a data storage client) issuing I/O commands (e.g., SCSI-based commands, and/or file-based commands) that read and/or write user data to a data storage system, and also receiving a response (possibly including requested data) in connection such I/O commands.

The control path, also sometimes referred to as the management path, may be characterized as the path or flow of data management or control commands through a system. For example, the control or management path may be the logical flow through hardware and software components or layers in connection with issuing data storage management command to and/or from a data storage system, and also receiving responses (possibly including requested data) to such control or management commands. For example, with reference to FIG. 1, the control commands may be issued from data storage management software executing on management system 22a to the data storage system 12. Such commands may be, for example, to establish or modify data services, provision storage, perform user account management, and the like. For example, commands may be issued over the control path to provision storage for LUNs, create a snapshot, define conditions of when to create another snapshot, define or establish local and/or remote replication services, define or modify a schedule for snapshot or other data replication services, define a RAID group, obtain data storage management and configuration information for display in a graphical user interface (GUI) of a data storage management program or application, generally modify one or more aspects of a data storage system configuration, list properties and status information regarding LUNs or other storage objects (e.g., physical and/or logical entities in the data storage system), and the like.

The data path and control path define two sets of different logical flow paths. In at least some of the data storage system configurations, at least part of the hardware and network connections used for each of the data path and control path may differ. For example, although both control path and data path may generally use a network for communications, some of the hardware and software used may differ. For example, with reference to FIG. 1, a data storage system may have a separate physical connection 29 from a management system 22a to the data storage system 12 being managed whereby control commands may be issued over such a physical connection 29. However, it may be that user I/O commands are never issued over such a physical connection 29 provided solely for purposes of connecting the management system to the data storage system. In any case, the data path and control path each define two separate logical flow paths.

An embodiment of a data storage system in accordance with techniques herein may perform different data processing operations or services on stored user data. For example, the data storage system may perform one or more data reduction operations, such as data deduplication and compression, as well as other types of operations or services. Such data reduction operations attempt to reduce the amount of storage needed for storing data on non-volatile backend storage devices (e.g., PDs) with the goal of reducing the cost per unit of storage consumed (e.g., dollar cost per GB of storage). Generally, data deduplication and compression techniques are known in the art and any suitable such technique may be used in an embodiment in accordance with techniques herein. In at least one embodiment, the compression technique may be a lossless compression technique such as an algorithm from the Lempel Ziv algorithm family (e.g., LZ77, LZ78, LZW, LZR, and the like). In at least one embodiment in accordance with techniques herein, data deduplication processing performed may include digest or hash value computation using an algorithm such as based on the SHA-256 hashing algorithm known in the art. Data deduplication generally refers to removing redundant or duplicate data portions. Data deduplication techniques may include looking for duplicate data chunks whereby only a single instance of the data chunk is retained (stored on physical storage) and where pointers or references may be used in connection with duplicate or redundant copies (which reference or identify the single stored instance of the data chunk).

Figure 2A:
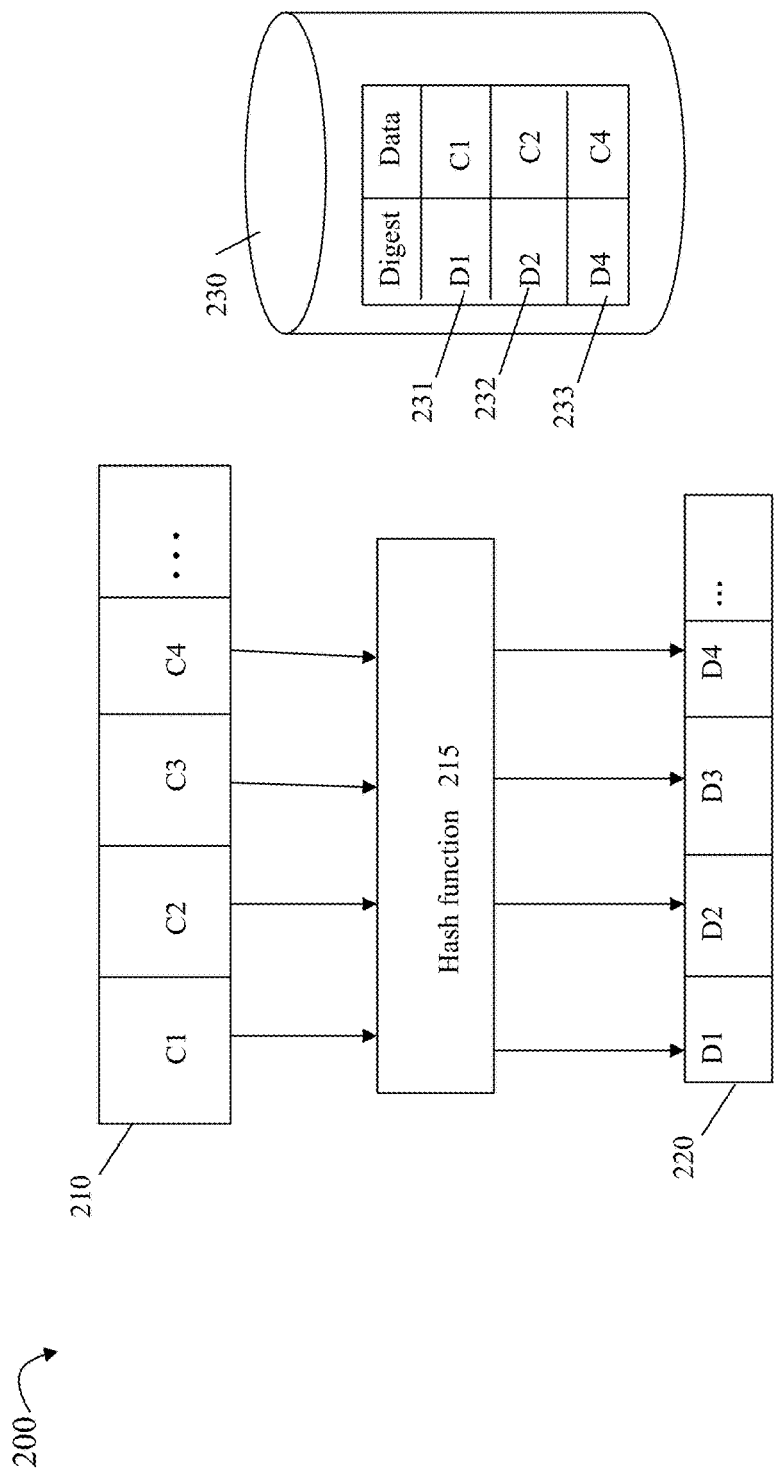
FIG. 2A is an example illustrating data deduplication as may be performed in an embodiment in accordance with techniques herein.

Referring to FIG. 2A, shown is an example 200 illustrating processing that may be performed in connection with data deduplication processing in an embodiment in accordance with techniques herein. Element 210 may denote the original data being written or stored on back-end non-volatile storage. The original data may be partitioned into multiple data chunks C1, C2, C3, C4 and the like. In at least one embodiment and for purposes of illustration, the data chunks may all be the same size where the size may vary with embodiment. As a variation depending on the data deduplication technique utilized, the chunks of 210 may be of varying or different sizes. Each chunk is provided as an input to hash function 215. As noted above, in at least one embodiment, the hash function 215 may be the SHA-256 hashing algorithm, or more generally, any suitable cryptographic hashing function known in the art. For each chunk of 210, the hash function 215 may perform processing and generate, as an output, a hash value or digest. Element 220 includes digests D1, D2, D3, D4, and the like, where a corresponding different one of the digests DN is generated for one of the chunks CN (where "N" is an integer denoting the chunk and associated digest generated for that chunk). For example, D1 is the digest generated for C1, D2 is the digest generated for C2, D3 is the digest generated for C3, and so on. Generally, a hash function 215 is selected which has an acceptably low probability of a "hash collision" of generating the same digest or hash value for two different chunks. The strength of the hash function 215 may be measured by the unlikelihood of a collision occurring two different input chunks of data produce the same digest. The strength increases with the bit length of the hash value or digest. Thus, if two chunks, such as C1 and C3, have the same digests whereby D1=D3, then chunks C1 and C3 match (e.g., are identical matching data chunks). If two chunks, such as C1 and C4, have different digests whereby D1 does not equal D4, then chunks C1 and C4 do not match (e.g., are different or non-matching data chunks). In cases where two matching or identical chunks have the same digest, only a single copy of the data chunk is stored on backend non-volatile physical storage of the data storage system. The single stored instance of the data chunk may be referenced using a pointer, handle, the digest of the chunk, and the like.

Element 230 of FIG. 2A may denote the data store used to store data chunks. In this example, as noted above, assume chunks C1 and C3 are the same with remaining chunks C2 and C4 being unique. The data store 230 may also be referred to as a single instance store (SIS). In at least one embodiment, element 230 may be organized and managed using a data structure, such as a hash table. In at least one embodiment, computed digests may be used as an index into the hash table where the single unique instances of data chunks may be stored (along with other metadata as may be needed for maintaining the table and also in accordance with the particular hash table management used in an embodiment). Hash tables are data structures known in the art. A hash table uses a hash function to compute an index into an array of buckets or slots, from which the desired data can be found. In this example, the chunk of data may be mapped by hash function 215, and thus by the chunk's digest, to a particular entry in the table at which the chunk data is stored. To further illustrate, the hash function 215 may be used to generate a digest for a particular data chunk. The digest is then further mapped (e.g., such as by another mathematical function, using particular portions of the digest, and the like) to a particular index or entry of the hash table. The particular mapping used to map the digest to a corresponding table entry varies, for example, with the digest and the size of hash table.

When storing a new data chunk, such as C1, its digest may be mapped to a particular hash table entry 231 whereby if the table entry is null/empty, or otherwise does not already include a data chunk matching C1, then C1 is stored in the table entry along with its associated digest D1 (this is the first time chunk C1 is recorded in the data store 230). Otherwise, if there is already an existing entry in the table including a data chunk matching C1, it indicates that the new data chunk is a duplicate of an existing chunk. In this example as noted above, processing is performed for C1, C2, and C4 respectively, where entries 231, 232, and 233 are added since there are no existing matching entries in the hash table. When processing chunk C3, as noted above, C3 has a digest D3 matching D1 whereby C3 (and thus D3) maps to entry 231 of the hash table already including a matching chunk C1 (so no additional data chunk is added to 230 for C3 since C3 is determined as a duplicate of C1). In connection with representing a particular file or other storage entity including multiple duplicate occurrences of a particular chunk such as C3, the single instance or copy of the data may be stored in 230. Additionally, a handle or reference, such as identifying the hash table entry 231, its digest, and the like, may be used to reference the single instance or copy of the data storage in 230. When reconstructing or restoring data such as the file to its original form, the handle or reference into the hash table for chunk C3 may be used to obtain the actual C3 chunk of data from 230.

Figure 2B:
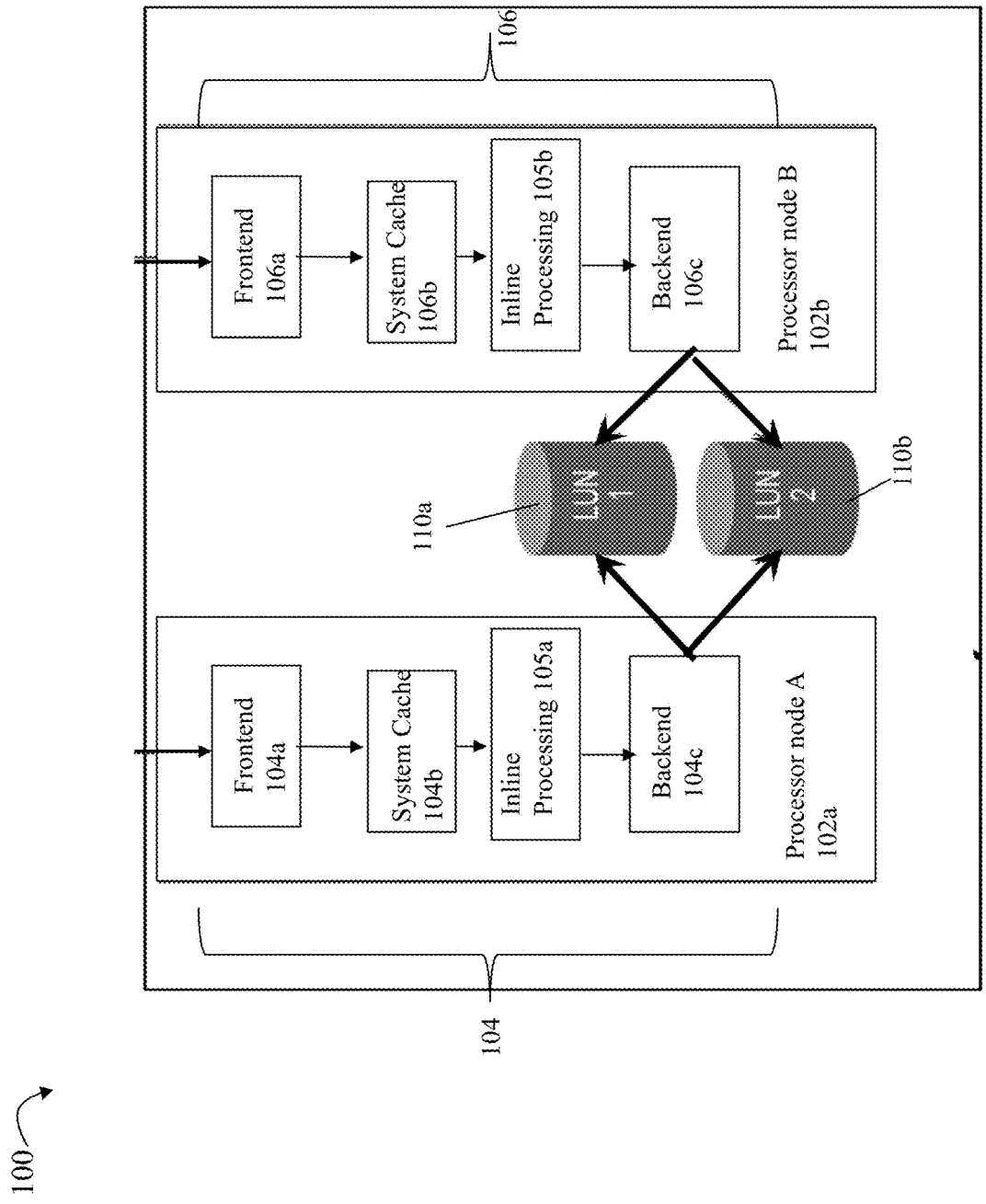

With reference to FIG. 2B, shown is an example 100 illustrating components that may be included in the data path in at least one existing data storage system in accordance with techniques herein. The example 100 includes two processor nodes A 102a and B 102b and associated software stacks 104, 106 of the data path where I/O requests may be received by either processor node 102a or 102b. In the example 200, the data path 104 of processor node A 102a includes: the frontend (FE) component 104a (e.g., an FA or front end adapter) that translates the protocol-specific request into a storage system-specific request; a system cache layer 104b where data is temporarily stored; an inline processing layer 105a; and a backend (BE) component 104c that facilitates movement of the data between the system cache and permanent non-volatile storage (e.g., back end physical non-volatile storage devices accessed by BE components such as DAs as described herein). During movement of data in and out of the system cache layer 104b (e.g., such as in connection with read and writing data respectively, to physical storage 110a, 110b, inline processing may be performed by layer 105a. Such inline processing operations of 105a may be optionally performed and may include any one of more data processing operations in connection with data that is flushed from system cache layer 104b to back-end non-volatile physical storage 110a, 110b, as well as when retrieving data from back-end non-volatile physical storage 110a, 110b to be stored in system cache layer 104b. In at least one embodiment, the inline processing may include performing compression and data duplication. Although in following paragraphs reference may be made to inline processing including compression and data deduplication, more generally, the inline processing may include performing any suitable or desirable data processing operations as part of the I/O or data path (e.g., where such operations may include any of compression and data deduplication, as well as any other suitable data processing operation).

In a manner similar to that as described for data path 104, the data path 106 for processor node B 102b has its own FE component 106a, system cache layer 106b, inline processing layer 105b, and BE component 106c that are respectively similar to components 104a, 104b, 105a and 104c. Elements 110a, 110b denote physical storage provisioned for LUNs whereby an I/O may be directed to a location or logical address to read data from, or write data to, the logical address. The LUNs 110a, 110b are examples of storage objects representing logical storage entities included in an existing data storage system configuration. Since, in this example, writes directed to LUNs 110a, 110b may be received for processing by either of the nodes 102a and 102b, the example 100 illustrates what may also be referred to as an active-active configuration.

In connection with a write operation as may be received from a host and processed by processor node A 102a, the write data may be written to the system cache 104b, marked as write pending (WP) denoting it needs to be written to physical storage 110a, 110b and, at a later point in time, the write data may be destaged or flushed from the system cache to the physical storage 110a, 110b by the BE component 104c. The write request may be considered complete once the write data has been stored in the system cache whereby an acknowledgement regarding the completion may be returned the host (e.g., by component 104a). At various points in time, WP data stored in the system cache is flushed or written out to physical storage 110a, 110b. In connection with inline processing layer 105a, prior to storing the original data on physical storage 110a, 110b, compression and data deduplication processing may be performed that converts the original data (as stored in the system cache prior to inline processing) to a resulting form (that may include compressed and/or deduplicated portions) which is then written to physical storage 110a, 110b. In at least one embodiment, when deduplication processing determines that a portion (such as a chunk) of the original data is a duplicate of an existing data portion already stored on 110a, 110b, that particular portion of the original data is not stored in a compressed form and may rather be stored in its deduplicated form (e.g., there is no need for compression of a chunk determined to be duplicate of another existing chunk). If the original data portion is not a duplicate of an existing portion already stored on 110a, 110b, the original data portion may be compressed and stored in its compressed form on 110a, 110b.

In connection with a read operation to read a chunk of data, a determination is made as to whether the requested read data chunk is stored in its original form (in system cache 104b or on physical storage 110a, 110b), or whether the requested read data chunk was previously deduplicated or compressed. If the requested read data chunk (which is stored in its original decompressed, non-deduplicated form) is in system cache, the read data chunk is retrieved from the system cache 104b and returned to the host. Otherwise, if the requested read data chunk is not in system cache 104b but is stored on physical storage 110a, 110b in its original form, the requested data chunk is read by the BE component 104c from the backend storage 110a, 110b, stored in the system cache and then returned to the host.

If the requested read data chunk was previously deduplicated, the read data chunk is recreated and stored in the system cache in its original form so that it can be returned to the host. If the requested read data chunk was previously compressed, the chunk is first decompressed prior to sending the read data chunk to the host. If the compressed read data chunk is already stored in the system cache, the data is uncompressed to a temporary or buffer location, the uncompressed data is sent to the host, and the buffer or temporary location is released. If the compressed read data chunk is not in system cache but stored on physical storage 110a, 110b, the compressed read data chunk may be read from physical storage 110a, 110b into system cache, uncompressed to a buffer or temporary location, and then returned to the host. Thus, requested read data stored on physical storage 110a, 110b may be stored in a deduplicated or compressed form as noted above where processing is performed by 105a to restore or convert the deduplicated or compressed form of the data to its original data form prior to returning the requested read data to the host.

In connection with techniques herein, each processor or CPU may include its own private dedicated CPU cache (also sometimes referred to as processor cache) that is not shared with other processors. In at least one embodiment, the CPU cache, as in general with cache memory, may be a form of fast memory (relatively faster than main memory which may be a form of RAM). In at least one embodiment, the CPU or processor cache is on the same die or chip as the processor and typically, like cache memory in general, is far more expensive to produce than normal RAM such as may be used as main memory. Processor cache is substantially faster than the system RAM such as used as main memory and contains information that the processor will be immediately and repeatedly accessing. The faster memory of the CPU cache may, for example, run at a refresh rate that's closer to the CPU's clock speed, which minimizes wasted cycles. In at least one embodiment, there may be two or more levels (e.g., L1, L2 and L3) of cache. The CPU or processor cache may include at least an L1 level cache that is the local or private CPU cache dedicated for use only by that particular processor. The two or more levels of cache in a system may also include at least one other level of cache (LLC or lower level cache) that is shared among the different CPUs. The L1 level cache serving as the dedicated CPU cache of a processor may be the closest of all cache levels (e.g., L1-L3) to the processor which stores copies of the data from frequently used main memory locations. Thus, the system cache as described herein may include the CPU cache (e.g., the L1 level cache or dedicated private CPU/processor cache) as well as other cache levels (e.g., the LLC) as described herein. Portions of the LLC may be used, for example, to initially cache write data which is then flushed to the backend physical storage.

When the processor performs processing, such as in connection with inline processing 105a, 105b as noted above, data may be loaded from main memory and/or other lower cache levels into its CPU cache. In particular, inline compression (ILC) and inline data deduplication (ILD) may be performed as part of inline processing 105a, 105b. In an embodiment in accordance with techniques herein, ILC and ILD may be synchronized to both concurrently perform processing on the same chunk or portion of data to prevent loading the data chunk being processed into the CPU's cache more than once. In at least one embodiment, the size of a data chunk processed by ILC and ILD may be 256 bytes.

Figure 3:
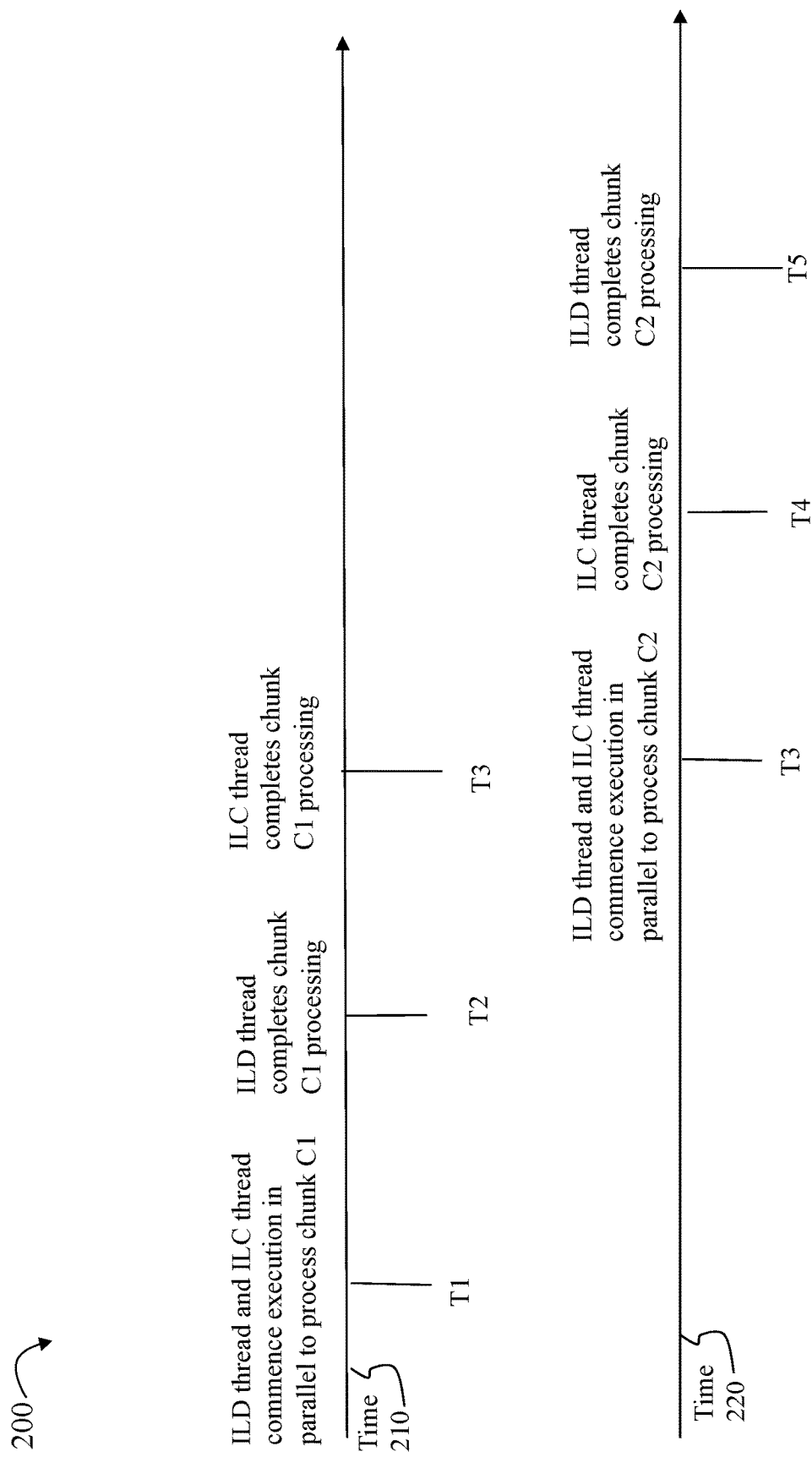
FIGS. 3 and 6 illustrates processing time lines of execution of processing that may be performed in embodiment in accordance with techniques herein.

In an embodiment in accordance with techniques herein, different threads performing concurrent processing may be synchronized and execute in parallel, such as on multiple cores of the same CPU having its own dedicated CPU cache. In such an embodiment, the different threads or processes may concurrently and in parallel perform processing for the same data chunk stored in the CPU cache. In particular, a first thread or process may perform ILC processing and a second thread or process may perform ILD processing. Execution of the first thread or process and the second thread or process may be performed in parallel and synchronized to both operate on the same data chunk concurrently. Execution of both threads operating on a current data chunk may be synchronized so that neither of the two threads proceeds to perform processing for another next chunk until both threads have completed processing for the same current chunk. For example with reference to FIG. 3, shown is execution processing time line 210 denoting processing performed by ILC and ILD threads for data chunk C1, and execution processing time line 220 denoting processing performed by ILC and ILD threads for data chunk C2. As illustrated by 210, assume the ILD thread and the ILC thread commence processing in parallel at time T1 operating on the same data chunk C1. In particular, at least data compression processing of the ILC thread and at least digest computation processing of the ILD thread are performed in parallel for a current data chunk C1. Assume at time T2, that the ILD thread completes processing for C1 but that the ILC thread has not yet completed its processing for C1. The ILC then completes its processing at a later time T3 for chunk C1. In this case, synchronization is performed so that the ILD thread waits (does not advance to processing another chunk) until the ILC thread completes its processing for chunk C1 at time T3. Responsive to both the ILD thread and the ILC thread having completed processing for the same chunk C1 at time T3, both the ILD thread and the ILC thread may again commence synchronized processing of the same next chunk C2. In this example for chunk C1, the synchronization processing causes the ILD thread to wait an amount of time denoted by T3-T2. More generally, the parallel synchronized execution of the ILD and ILC threads proceeds with processing of each chunk at the speed of the slower of the two threads. At time T3, both the ILD thread and the ILC thread have completed processing of chunk C1 and both commence with synchronized parallel execution of processing of the next chunk C2 as illustrated by 220. At time T4, assume the ILC thread completes processing for chunk C2 but the ILD thread has not yet completed its processing for chunk C2. In this case, synchronization is performed so that the ILC thread waits (does not advance to processing another chunk) until the ILD thread completes its processing for chunk C2 at time T5. Responsive to both the ILD thread and the ILC thread having completed processing for the same chunk C2 at time T5, both the ILD thread and the ILC thread may again commence synchronized processing of the same next chunk. If any. In this example with chunk C2, the synchronization processing causes the ILC thread to wait an amount of time denoted by T5-T4. Thus, although ILD and ILC are independent algorithms that may concurrently operate on the same data chunk, synchronization of the parallel ILD and ILC threads may be used to avoid having to fetch the same chunk of data from main memory for processing more than once. Having multiple threads for ILD and ILC processing allows executing both the ILD and ILC processing of the same data chunk to be performed in parallel whereby neither thread advances to process another data chunk until the slower of the two threads also completes. In this manner, where both the ILD and ILC threads execute on a CPU and perform processing for the same data chunk, the data chunk is fetched from main memory once and the stored in the CPU cache where it is accessible and used during parallel execution of both the ILD and ILC threads.

As just described, at least data compression processing of the ILC thread and at least digest computation processing of the ILD thread may be performed in parallel for a current data chunk C1 to avoid repeatedly fetching and loading the same data chunk into the CPU cache more than once to perform such processing. The digest may be used in determining whether the current chunk can be deduplicated (e.g., is a duplicate of an existing already stored chunk). If the current chunk is a duplicate, the compressed form of the current chunk (obtained as a result of performing ILC in parallel with ILD digest processing) may be discarded.

Compression processing such as performed by ILC threads is generally a CPU intensive operation. However, as discussed in more detail herein, there is a relationship between entropy and data compression where a computed entropy value for a data chunk may denote a measure or degree of compressibility of the data chunk. Generally, computation of an entropy value for a data chunk may be characterized as lightweight in terms of CPU requirements as opposed to performing compression processing for the data chunk. In an embodiment in accordance with techniques herein, the computed entropy value for a data chunk may be used in determining whether or not to proceed with compressing the data chunk. The foregoing is generally more CPU efficient than compressing each data chunk in order to determine whether or not it is compressible or otherwise achieves at least a minimum amount of data reduction (e.g., whether or not a compressed form of a data chunk has a reduced size that is less than the size of the original data chunk by at least a threshold amount).

In at least one embodiment in accordance with techniques herein, entropy computation for a data chunk may be performed in parallel with digest computation (e.g., where the digest is used in connection with ILD processing) for CPU efficiency. Subsequently, the computed digest may be used to determine whether the data chunk can be deduplicated. If the data chunk can be deduplicated (whereby the chunk is a duplicate of an existing chunk and the computed digest for the chunk is mapped to the existing stored data chunk), then compression is not performed and the data chunk is deduplicated. If the data chunk cannot be deduplicated (whereby the chunk is not a duplicate of an existing chunk and the computed digest for the chunk does not map to an existing stored data chunk), then the entropy value for the chunk may be used to determine whether or not to proceed with compression of the chunk. The foregoing and other aspects of techniques herein are described in more detail in following paragraphs.

Information entropy may be characterized as the average rate at which information is produced by a stochastic source of data. The definition of entropy used in information theory is analogous to the definition used in statistical thermodynamics. The concept of information entropy was introduced by Claude Shannon in "A Mathematical Theory of Communication", The Bell System Technical Journal (Volume: 27, Issue: 3, July 1948; pages 379-423. The measure of information entropy associated with each possible data value may be expressed as the negative logarithm of the probability mass function for the value. When the data source has a lower-probability value (i.e., when a low-probability event occurs), the event carries more "information" ("surprisal") than when the source data has a higher-probability value. The amount of information conveyed by each event defined in this way becomes a random variable whose expected value is the information entropy. Generally, entropy refers to disorder or non-uniformity. As a metric, an entropy value denotes a measure of the randomness of data, or a randomness distribution of symbols.

The relationship between entropy and compressibility is discussed, for example, in "Relationship Between Entropy and Test Data Compression", Kedarnath J. Balakrishnan and Nur A. Touba, IEEE Transactions on Computer-Aided Design of Integrated Circuits and Systems, Vol. 26, No. 2, February 2007, pages 386-395, and "Entropy and Compressibility of Symbol Sequences", Werner Ebeling, PhysComp96 (Physics and Computation 1996), Feb. 23, 1997, both of which are incorporated by reference herein. As explained in "Relationship between Entropy and Test Data Compression", entropy of a data set is a measure of the amount of information in the data set. Entropy calculations for fully specified data have been used to get a theoretical bound on how much the data can be compressed. In "Relationship between Entropy and Test Data Compression", the concept of entropy is extended for incompletely specified test data that has unspecified or don't care bits. "Entropy and Compressibility of Symbol Sequences" investigates long-range correlations in symbol sequences using methods of statistical physic and non-linear dynamics.

Entropy, H, with respect to a data set may be expressed as:

$$H = -\Sigma_{i=0}^{N-1} P_i \log_2(P_i)$$ EQUATION 1

Where $P_i$ is the probability of occurrence of symbol $X_i$ in the data set;

N is the total number of unique symbols; and $\log_2$ is the base 2 logarithm.

Generally, entropy for the data set depends on the symbol length L. Assume the data set is partitioned into sections where each section includes L bits of data. Thus L denotes number of bits in each section and L also denotes the length of the symbol. For a given symbol length, entropy for the data may be calculated to provide a value that denotes an expected or predicted level of compressibility for the data. Note that $P_i$, the probability of symbol $X_i$, refers to the actual frequency of the symbol $X_i$ in the data set. Thus, $P_i$ for $X_i$ may be calculated as the frequency or number of times $X_i$ appears in the data set divided by the total number of sections in the data set.

It should be noted, although particular values are selected for purposes of illustration, generally the entropy value used with techniques herein may be included for any size data chunk or data set that may include symbols of any suitable number of bits (e.g., any symbol length) having any number of unique symbols.

In at least one embodiment in accordance with techniques herein, L may be 8 where each symbol may include 8 bits (e.g., have a symbol length of 8). In such an embodiment, each symbol or bit pattern of 8 bits denotes a byte of information having a numerical data value (base 10) in the range from 0 to 255, inclusively. In such an embodiment, N, the number of unique symbols (e.g., numerical value of bit patterns) is 256, and EQUATION 1 for calculating entropy, H, may be expressed as:

$$H = -\sum_{i=0}^{255} P_i \log_2(P_i)$$ EQUATION 2

The entropy values calculated using EQUATION 1 and EQUATION 2 are (e.g., real numbers) within the inclusive range of 0 to 8, where 0 denotes the maximum expected level of compressibility of the data set and 8 denotes the minimum expected level of compressibility of the data set. For a given data set, the larger the entropy value (e.g., closer to 8), the more random the data and the less compressible the data set; and the smaller or lower the entropy value (e.g., close to 0), the more uniform the data and the more compressible the data set.

In at least one embodiment, an entropy value may be determined for each 8 KB (kilobyte) chunk. Thus, each 8 KB chunk includes 8192 bytes (e.g., 8*1024).

Figure 4:
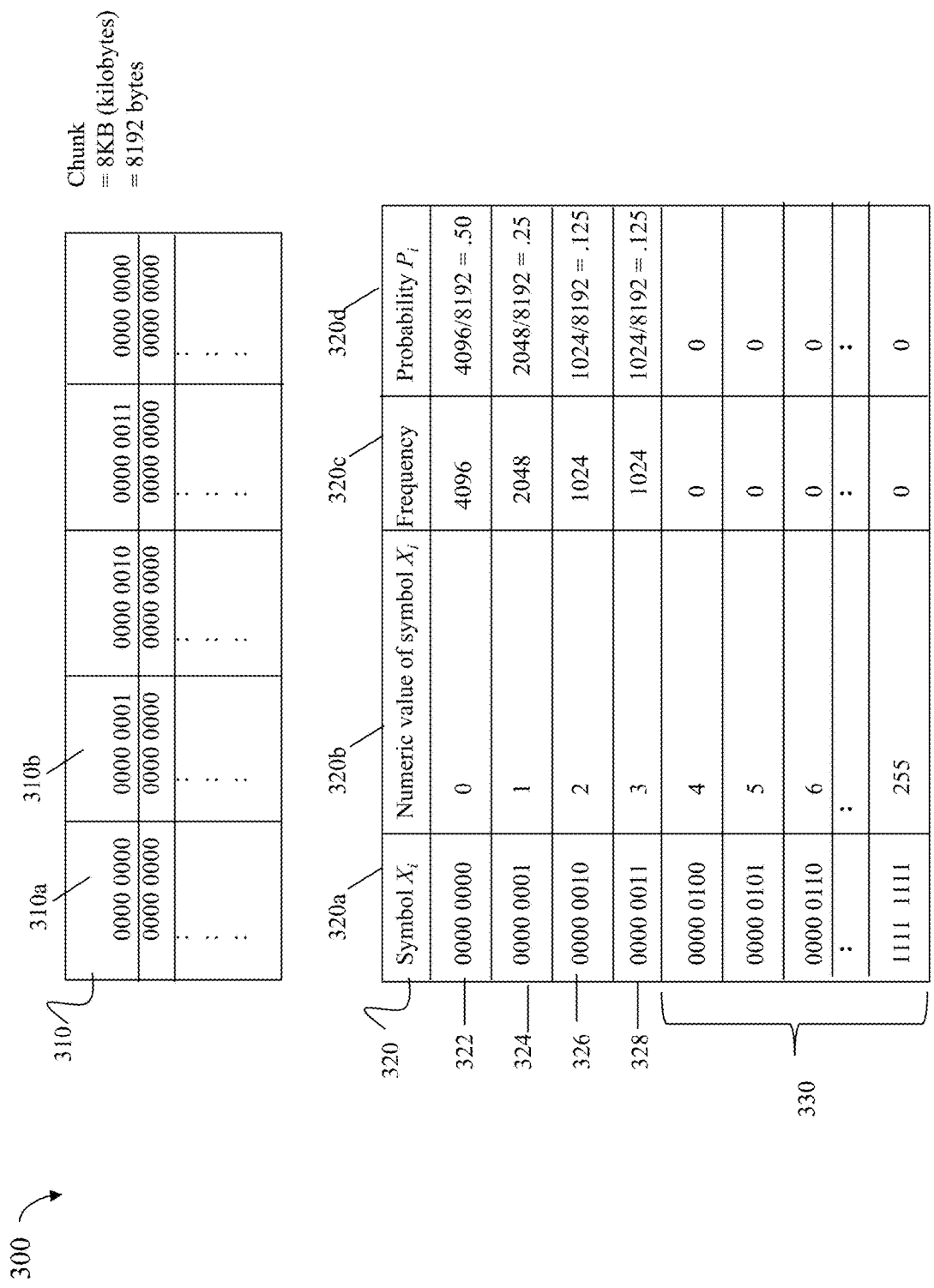
FIG. 4 is an example illustrating a data chunk and associated information that may be used in connection with calculating an entropy value for the data chunk an embodiment in accordance with techniques herein.

Referring to FIG. 4, shown is an example 300 illustrating a data chunk and associated information that may be used in an embodiment in accordance with techniques herein. The example 300 includes data chunk 310 having a size of 8 KB. The data chunk 310 may be partitioned into bytes or 8 bit segments where each byte denotes a symbol having a numeric value from 0 to 255, inclusively. For example, element 310a denotes a byte or symbol having a value of 0 and element 310b denotes a byte or symbol having a value of 1. To calculate the entropy for chunk 310, information in table 320 may be determined. Table 320 includes the following columns: symbol $X_i$ 320a, numeric value of symbol $X_i$ 320b, frequency of $X_i$ 320c and probability $P_i$. Each row of 320 includes a set of information for each unique symbol that can occur in the chunk. Thus, table 320 may include 256 rows, one row for each of the unique symbols having corresponding numeric values from 0 to 255, inclusively. Row 322 denotes that the numeric value 0 for symbol "0000 0000" has a frequency of 4096 and a probability $P_i$=0.50. Row 324 denotes that the numeric value 1 for symbol "0000 0001" has a frequency of 2048 and a probability $P_i$=0.25. Row 326 denotes that the numeric value 2 for symbol "0000 0010" has a frequency of 1024 and a probability $P_i$=0.125. Row 328 denotes that the numeric value 3 for symbol "0000 0011" has a frequency of 1024 and a probability $P_i$=0.125. Element 330 indicates that the remaining symbols each have a frequency=0 and thus a probability $P_i$=0. Based on EQUATION 2 and using the information from table 320 for the chunk 310, the calculated entropy value for chunk 310 is 1.75. Based on the range of possible entropy values from 0 to 8, inclusively, an embodiment may use the entropy value of 1.75 to determine whether or not to compress the chunk 310. For example, consistent with discussion herein, an embodiment may perform the entropy calculation for the chunk 310 inline as part of ILC processing of the I/O or data path, when writing or storing chunk 310 to PDs such as illustrated and described in connection with FIG. 2B. Based on the calculated entropy value for the chunk such as may be performed as part of ILC processing, an embodiment may determine whether to perform compression of the chunk inline as part of the I/O or data path.

In at least one embodiment, an entropy threshold may be specified where compression, such as part of ILC, may be performed for chunks having an entropy value less than the threshold. Otherwise, the chunk may not be compressed as part of ILC processing. Thus, the threshold denotes a maximum allowable entropy level in order for ILC to compress the chunk. Generally, any suitable value for the threshold may be selected. For example, in at least one embodiment, the threshold may be a value within the range of 5.0 to 6.0, inclusively.

Figure 5:
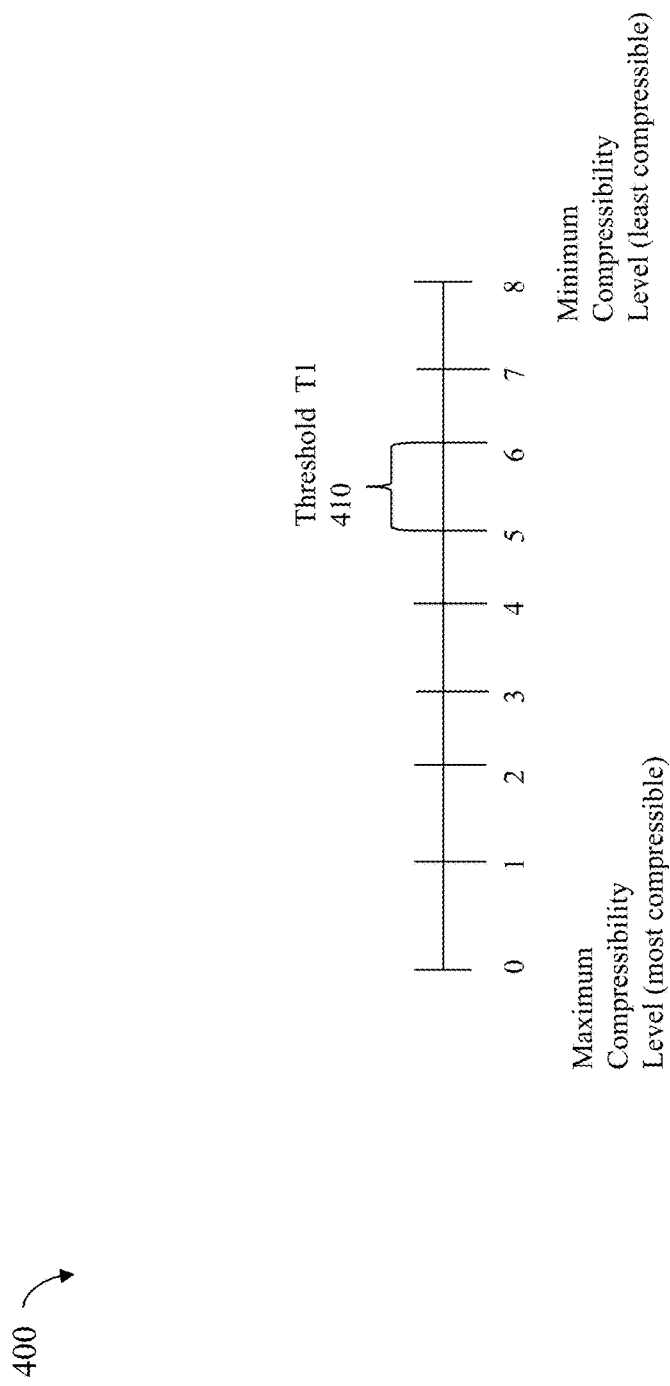
FIG. 5 is an example illustrating selection of an entropy threshold used in an embodiment in accordance with techniques herein.

Reference is made to FIG. 5 illustrating a threshold range within which a threshold for may be selected for use in an embodiment in accordance with techniques herein. The example 400 illustrates the possible range of entropy values from 0 to 8, inclusively where element 410 denotes that the entropy threshold T1 may be a value (e.g., real number) selected within the range of 5.0 to 6.0, inclusively. For example, assume T1 is selected as 6.0 whereby chunks have associated entropy values within the range 0 to 6.0, inclusively, are compressed. With reference to the example described above in connection with FIG. 4 for chunk 310 having an entropy value of 1.75, it may be determined to compress the chunk 310 inline (e.g., as part of ILC processing).

Figure 6:
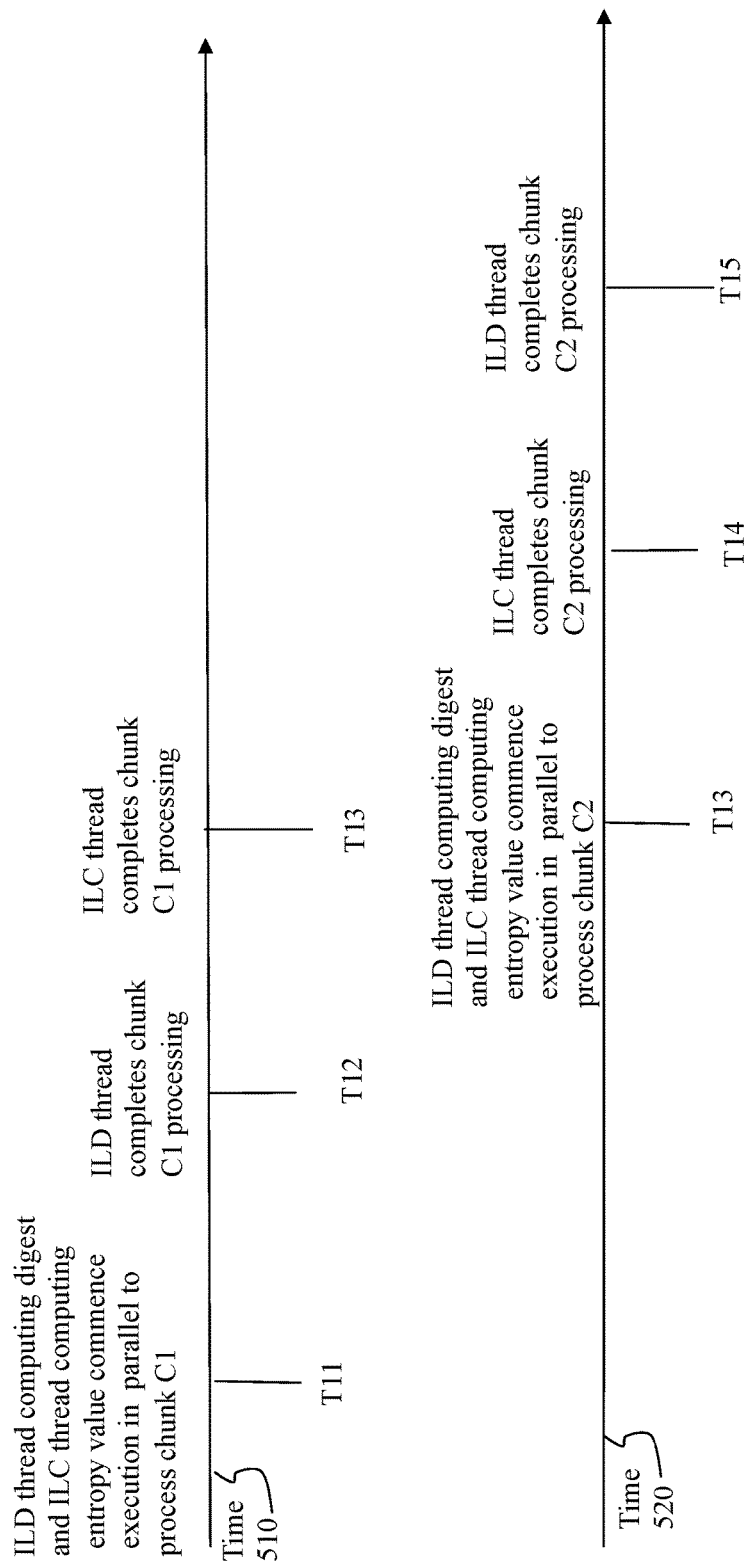

In at least one embodiment as also described herein, calculation of the entropy value for the chunk 310 may be performed in parallel with the digest computation for the chunk 310. In an embodiment in accordance with techniques herein, different threads performing concurrent processing may be synchronized and execute in parallel, such as on multiple cores of the same CPU having its own dedicated CPU cache. In such an embodiment, the different threads or processes may concurrently and in parallel perform processing for the same data chunk stored in the CPU cache. In particular, a first thread or process of ILC may calculate the entropy value for a chunk and a second thread or process of ILD may calculate the digest for the same chunk. Execution of the first thread or process and the second thread or process may be performed in parallel and synchronized to both operate on the same data chunk concurrently. Execution of both threads operating on a current data chunk may be synchronized so that neither of the two threads proceeds to perform processing for another next chunk until both threads have completed processing for the same current chunk. For example with reference to FIG. 6, shown is execution processing time line 510 denoting processing performed by an ILC thread that calculates the entropy value for chunk C1 and an ILD thread that calculates the digest for chunk C1, and execution processing time line 520 denoting processing performed by the ILC and ILD threads for data chunk C2. As illustrated by 510, assume the ILD thread and the ILC thread commence processing in parallel at time T11 operating on the same data chunk C1. In particular, at time T11, entropy value computation processing of the ILC thread and digest computation processing of the ILD thread commence and are performed in parallel for a current data chunk C1. Assume at time T12 that the ILD thread completes processing for C1 but that the ILC thread has not yet completed its processing for C1. The ILC thread then completes its processing at a later time T13 for chunk C1. In this case, synchronization is performed so that the ILD thread waits (does not advance to processing another chunk) until the ILC thread completes its processing for chunk C1 at time T13. Responsive to both the ILD thread and the ILC thread having completed processing for the same chunk C1 at time T13, both the ILD thread and the ILC thread may again commence synchronized processing of the same next chunk C2. In this example for chunk C1, the synchronization processing causes the ILD thread to wait an amount of time denoted by T13-T12. More generally, the parallel synchronized execution of the ILD and ILC threads proceeds with processing of each chunk at the speed of the slower of the two threads. At time T13, both the ILD thread and the ILC thread have completed processing of chunk C1 and both commence with synchronized parallel execution of processing of the next chunk C2 as illustrated by 220. At time T14, assume the ILC thread completes entropy computation processing for chunk C2 but the ILD thread has not yet completed its digest computation processing for chunk C2. In this case, synchronization is performed so that the ILC thread waits (does not advance to processing another chunk) until the ILD thread completes its processing for chunk C2 at time T15. Responsive to both the ILD thread and the ILC thread having completed processing for the same chunk C2 at time T15, both the ILD thread and the ILC thread may again commence synchronized processing of the same next chunk, if any. In this example with chunk C2, the synchronization processing causes the ILC thread to wait an amount of time denoted by T15-T14. Thus, although digest computation processing performed by the ILD thread and entropy computation processing performed by the ILC thread are independent algorithms that may concurrently operate on the same data chunk, synchronization of the parallel ILD and ILC threads may be used to avoid having to fetch the same chunk of data from main memory for processing more than once. Having multiple threads for ILD and ILC processing allows executing both the ILD and ILC threads processing the same data chunk to be performed in parallel whereby neither thread advances to process another data chunk until the slower of the two threads also completes. In this manner, where both the ILD and ILC threads execute on a CPU and perform processing for the same data chunk, the data chunk is fetched from main memory once and then stored in the CPU cache where it is accessible and used during parallel execution of both the ILD and ILC threads.

Figure 7:
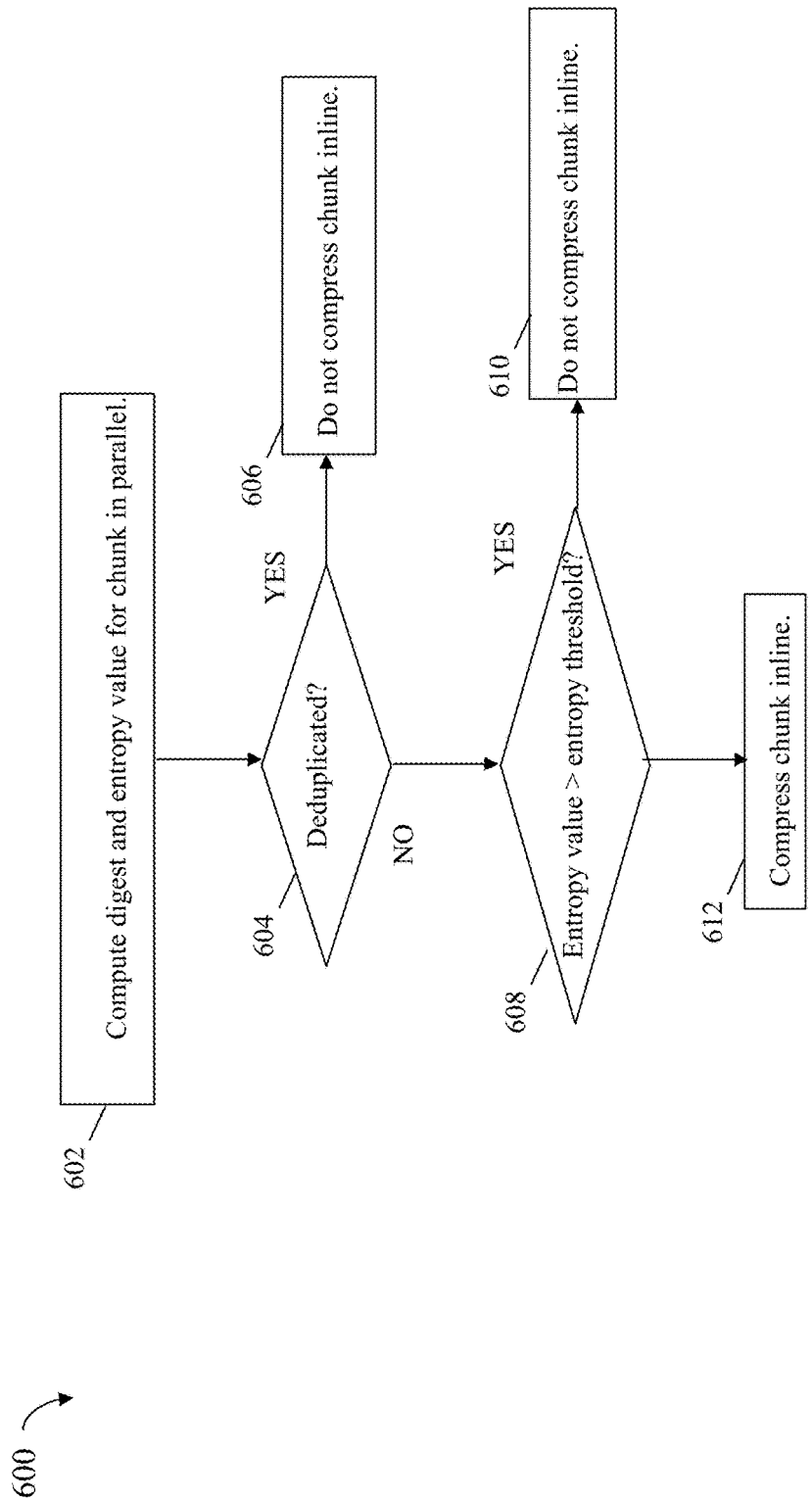
FIGS. 7, 9 and 10 are flowcharts of processing steps that may be performed in an embodiment in accordance with techniques herein.

Referring to FIG. 7, shown is a flowchart 600 of processing steps that may be performed in an embodiment in accordance with techniques herein. The steps of 600 may be performed for a data chunk. At step 602, the digest and entropy value for the chunk are computed in parallel such as described elsewhere herein. From step 602, control proceeds to step 604 where a determination is made as to whether the chunk can be deduplicated (whereby the current chunk is a duplicate of an existing chunk already stored in a data store (such as 230 of FIG. 2A). Step 604 determination may be made using the digest computed for the chunk where, in at least one embodiment, the digest is mapped to an entry or location in a hash table. If the entry already is already includes data for an existing chunk stored in the data store 230, then the current chunk is a duplicate and may be deduplicated in the data set including the current data chunk (e.g., where a token or reference to the chunk (e.g., digest, hash table entry, or pointer to location in data store where chunk is stored) may be included in the deduplicated data set rather than a duplicate copy of the chunk. If step 604 evaluates to yes, control proceeds to step 606 where the chunk is not compressed inline. In step 606, the chunk may be deduplicated inline rather than compressed. If step 604 evaluates to no (e.g., the current chunk is not a duplicate of an existing chunk already stored in the data store 230), then control proceeds to step 608. In step 608, a determination is made as to whether the entropy value for the chunk is greater than the entropy threshold. If step 608 evaluates to yes, control proceeds to step 610 where the chunk is not compressed inline. In step 610, the chunk may be stored in its original uncompressed form. If step 608 evaluates to no, control proceeds to step 612 where the chunk is compressed inline. In step 612, the chunk may be stored in its compressed form.

Figure 8:
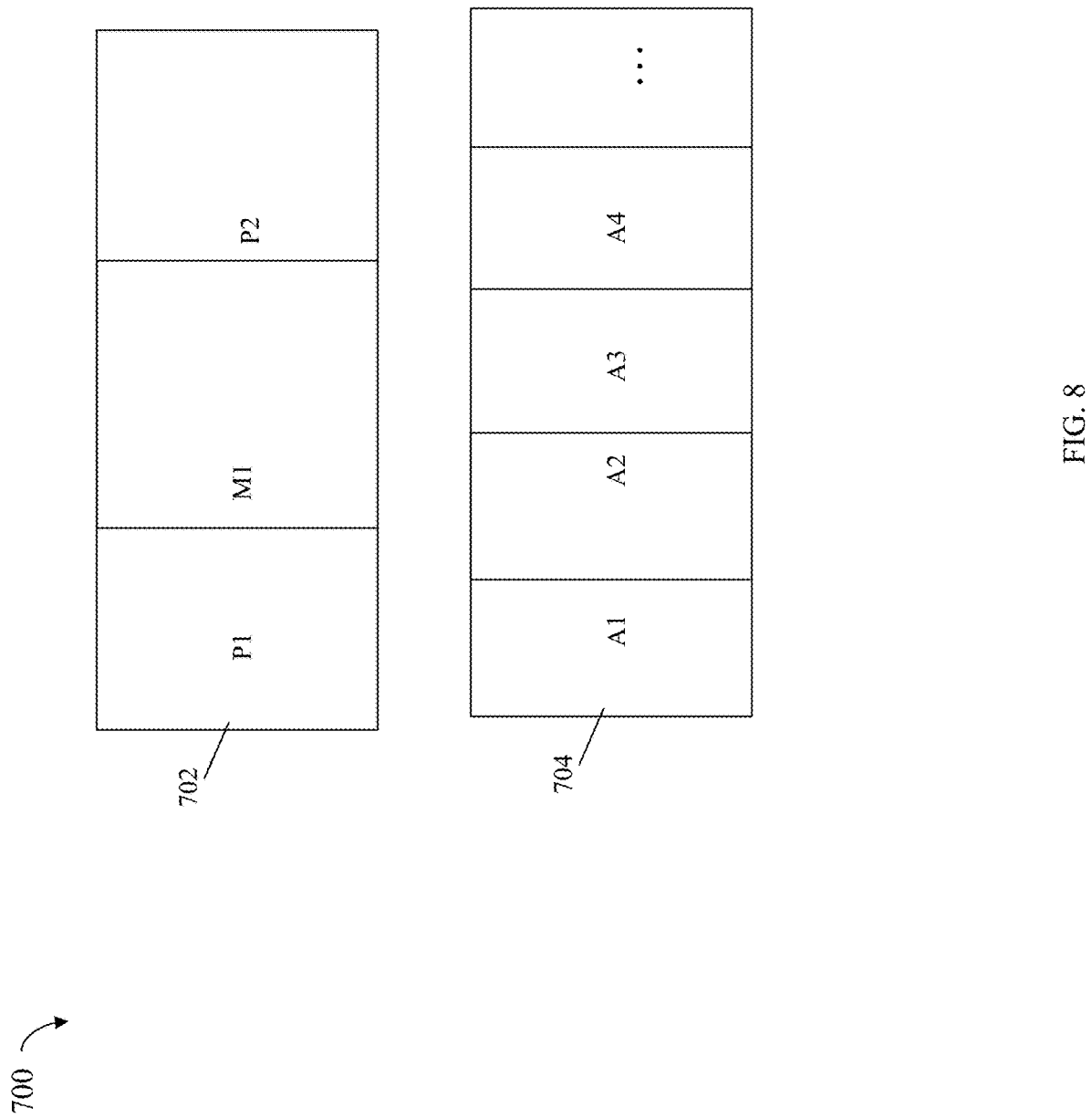
FIG. 8 is an example illustrating different bytes of a chunk that may be selected for entropy value computation in an embodiment in accordance with techniques herein.

As a variation, for each chunk, an embodiment may calculate an entropy value for the chunk using less than all the bytes of chunk data. With reference back to chunk 310 of FIG. 4, an embodiment may determine an entropy value for the 8 KB chunk using a number of bytes X that is less than all the bytes of the chunk. Thus, the total number of bytes X used in determining the entropy value for the chunk is no longer 8192. In one embodiment, the number of bytes selected may be determined as a percentage of the total number of bytes in the chunk. For example, with reference to 702 of FIG. 8, an embodiment may calculate an entropy value for the chunk using a portion of the chunk data such as a number of bytes selected from the middle M1 of the chunk where a number of bytes are omitted from both the beginning P1 and ending P2 of the chunk. As another variation, with reference to 704 of FIG. 8, an embodiment may calculate an entropy value for the chunk using alternating portions (e.g., every other portion) of the chunk data. For example, assume the chunk is partitioned into "m" logically consecutive and contiguous segments denoted A1 through Am. In this case, the entropy value for the chunk may be calculated using only the odd numbered segments A1, A3, and like, or only the even numbered segments. Generally, each segment may be one or more logically consecutive and contiguous bytes of the chunk. In one embodiment, each segment may be a single byte whereby the entropy value for the chunk is calculated using alternating bytes of the chunk.

An entire data set, such as generated by an application executing on a host, may be partitioned into multiple chunks where an entropy value may be computed for each of the multiple chunks of the data set. For example, a data set may be a backup data set, one or more files, one or more directories, one or more file systems, and the like. An embodiment in accordance with techniques herein may perform processing as described herein, such as in connection with FIG. 7, for each chunk of the entire data set. As a variation, an embodiment may perform an optimization on the data set including multiple chunks. An embodiment may determine the compressibility of the entire data set by computing entropy values for less than all chunks of the data set. For example, for a data set including Y chunks, an embodiment may select a set of Z chunks, where Z<Y, and compute entropy values for all Z chunks. Z may be determined, for example, as a specified percentage of Y. For example, the Z chunks may be randomly selected, every other or alternating chunks of the data set (e.g., in a manner similar to selection of bytes in 702), chunks selected from the middle of the data set omitting at least some chunks from the beginning and ending of the data set (e.g., in a manner similar to selection of bytes in 704), and the like. In this case, the Z chunks may denote a sampling of chunks representative of the entire data set. Processing may be performed to determine whether the entropy values for the selected Z chunks are statistically similar (e.g., within a specified tolerance or threshold). If the Z chunks are determined to be statistically similar, then the entropy values for the Z chunks may be used to determine an overall or aggregate entropy value for the entire data set used to determine whether or not to compress all chunks of the entire data set.

For the data set using the selected chunks and associated entropy values for the selected chunks, a determination of whether the associated entropy values for the selected chunks are similar, such as statistically similar, may be performed using any suitable technique. For example, the entropy values for the selected chunks may be determined as statistically similar if all such entropy values meet specified similarity criteria, such as if all entropy values are within some specified threshold or tolerance with respect to the mean of the entropy values for the selected chunks. For example, the mean or average of the entropy values for the selected chunks may be determined. Subsequently, the variance or standard deviation of the entropy values with respect to the mean may be determined. If all entropy values (or others at least a specified percentage or number for the selected entropy values) are within a specified number of standard deviations (e.g., within 2 standard deviations from the mean) or variance from the mean, then the selected chunks may be determined to be statistically similar and the mean or average entropy value of the selected chunks may be used as the aggregate entropy value for the entire data set to make decision about whether to compress entire data set. In this manner, if the entropy values of the selected chunks are statistically similar, processing may then assume that the remaining chunks of the data set (for which no entropy value was actually calculated) also have an entropy value similar to those of the selected chunks. In other words, the mean value of the statistically similar entropy values of the selected sample may be applied as an attribute or characteristic to all chunks of the data set.

If processing determines that the entropy values for the selected chunks of the data set are not statistically similar, then processing does not assume the mean value of such entropy values are characteristic or typical of all chunks in the data set. If processing determines that the entropy values for the selected chunks of the data set are not statistically similar, processing may be performed to compute entropy values for all chunks of the data set.

Figure 9:
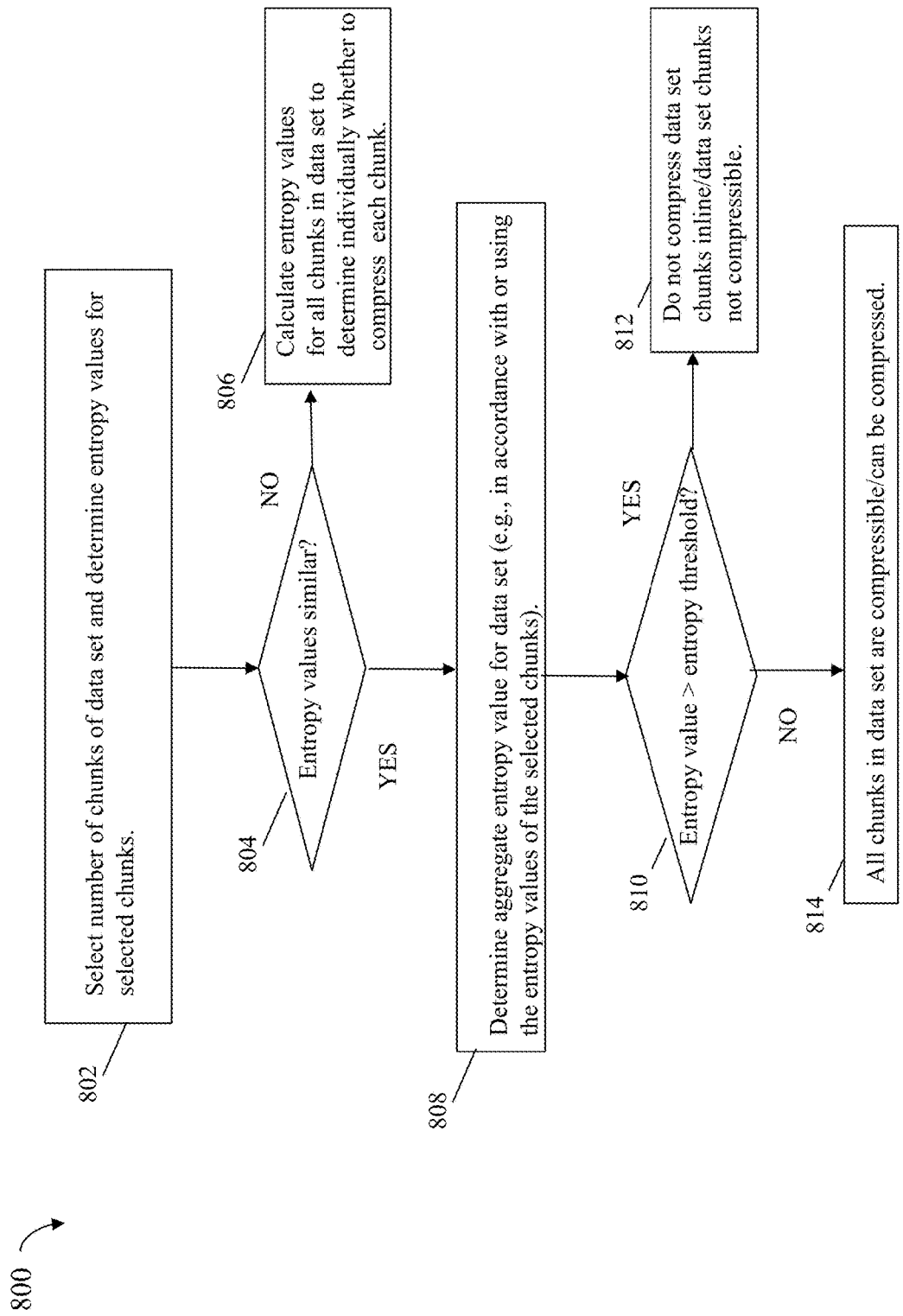

Referring to FIG. 9, shown is a flowchart 800 of processing steps that may be performed in an embodiment in accordance with techniques herein for a data set of multiple chunks. The steps of 800 may be performed per data set and summarize processing described above. At step 802, a number of chunks of the data are selected. The number of selected chunks is less than the total number of chunks in the data set. Entropy values for the selected chunks are determined in step 802. Step 802 may include calculating the digest and entropy value for each selected chunk in parallel (e.g., such as described in connection with FIG. 6). From step 802, processing proceeds to step 804. In step 804, a determination is made as to whether the entropy values of the selected chunks are similar. If step 804 evaluates to no, control proceeds to step 806. In step 806, processing may be performed to determine individually whether to compress each chunk of the data set. Step 806 may include calculating entropy values for all chunks in the data set to determine individually whether to compress each chunk. Step 806 may include performing parallel processing of entropy values and digest computation for chunks as described elsewhere herein such as, for example, as described in connection with FIGS. 4, 6 and 7. If step 804 evaluates to yes, control proceeds to step 808. At step 808, an aggregate entropy value for the entire data set is determined. The aggregate entropy value for the data set may be determined in accordance with, or using, the entropy values of the selected chunks. From step 808, control proceeds to step 810. At step 810, a determination is made as to whether the aggregate entropy value for the data set is greater than the entropy threshold. If step 810 evaluates to yes, control proceeds to step 812 where none of the data set chunks are determined as compressible whereby none of the chunks are compressed inline. In connection with step 812, processing may be performed for the data set to determine whether to deduplicate any chunks of the data set. However, if such chunks are not deduplicatable, then the chunks are not compressed. Step 812 may include using the digests computed for chunks of the data set to determine whether such chunks can be deduplicated. If a chunk of the data set cannot be deduplicated however, the chunk may be determined not compressible (e.g., do not compress the chunk) based on the aggregated entropy value for the data set. If step 810 evaluates no, control proceeds to step 814. In step 814, a determination may be made that all chunks of the data set are compressible and can be compressed. Step 814 may include compressing all chunks of the data set if such chunks are not otherwise deduplicated.

An embodiment may vary the current value of the entropy threshold in accordance with the workload or level of "busyness" of the data storage system. An embodiment may use one or more metrics to determine the current workload or level of "busyness" of the data storage system. For example, an embodiment may vary and select the entropy threshold in accordance with an observed or measured utilization of one or more data storage system resources or components such as utilization of CPUs, memory, cache, DAs, and/or FAs. The current workload may be measured in terms of average I/O response time, I/O rate (e.g., I/Os per second), bandwidth or data transfer rate (e.g., between host and data storage system such as through the FA/HA), and the like. Depending on the workload or level of "busyness" of the data storage system (e.g., such as in comparison to one or more threshold workload or utilization levels), an embodiment may regulate or vary the amount of compression performed inline such as by increasing the entropy threshold. For example, the entropy threshold may be initially set to 5.0. If the data storage system is determined to have a high workload above a specified threshold (e.g., CPU utilization above specified utilization threshold), the entropy threshold may be decreased to another value less than 5.0 but also greater than 4.0. The amount by which the entropy threshold is decreased may be scaled or selected in accordance with the measured workload or utilization. In at least one embodiment when the entropy threshold is decreased, such as from 5.0 to 4.0 (e.g., where ILC is performed for chunks having an associated entropy value that does not exceed 4.0) to reduce the amount of ILC performed, processing may record a list of chunks and/or data sets having computed entropy values which exceed 4.0 and are also not greater than 5.0 (prior entropy threshold). In this case, the data storage system may perform processing to compress such identified chunks and/or data sets in the list offline (e.g., not as part of the IO or data path) during times of lower system workload. If the data storage system is determined to have low workload below a specified threshold (e.g., CPU utilization above specified utilization threshold), the entropy threshold may be increased to another value greater than 5.0 but also more than 6.0. The amount by which the entropy threshold is increased may be scaled or selected in accordance with the measured workload or utilization.

Additionally, the particular technique used for entropy value calculation may also vary with the workload or level of "busyness" of the data storage system. For example, if the data storage system is determined to have a high workload (e.g., above specified threshold), then one or more of the techniques such as described in connection with FIGS. 8 and 9 may be utilized rather than, for example, using all bytes of all data chunks such as described in connection with FIG. 4.

Generally, an embodiment in accordance with techniques herein may dynamically change and adapt processing performed such as for entropy value computation and, more generally, in connection with compression such as ILC based on the workload or level of busyness of the data storage system. Such adapting provides for improved data storage system and I/O performance by adapting resource usage consumed for ILC, compression generally, and entropy computation based on the workload or level of busyness of the data storage system. Such adapting reduces resources consumed in connection with ILC, compression in general, and entropy computation if the system workload is heavy in order to improve I/O RT and general data storage system performance.

Figure 10:
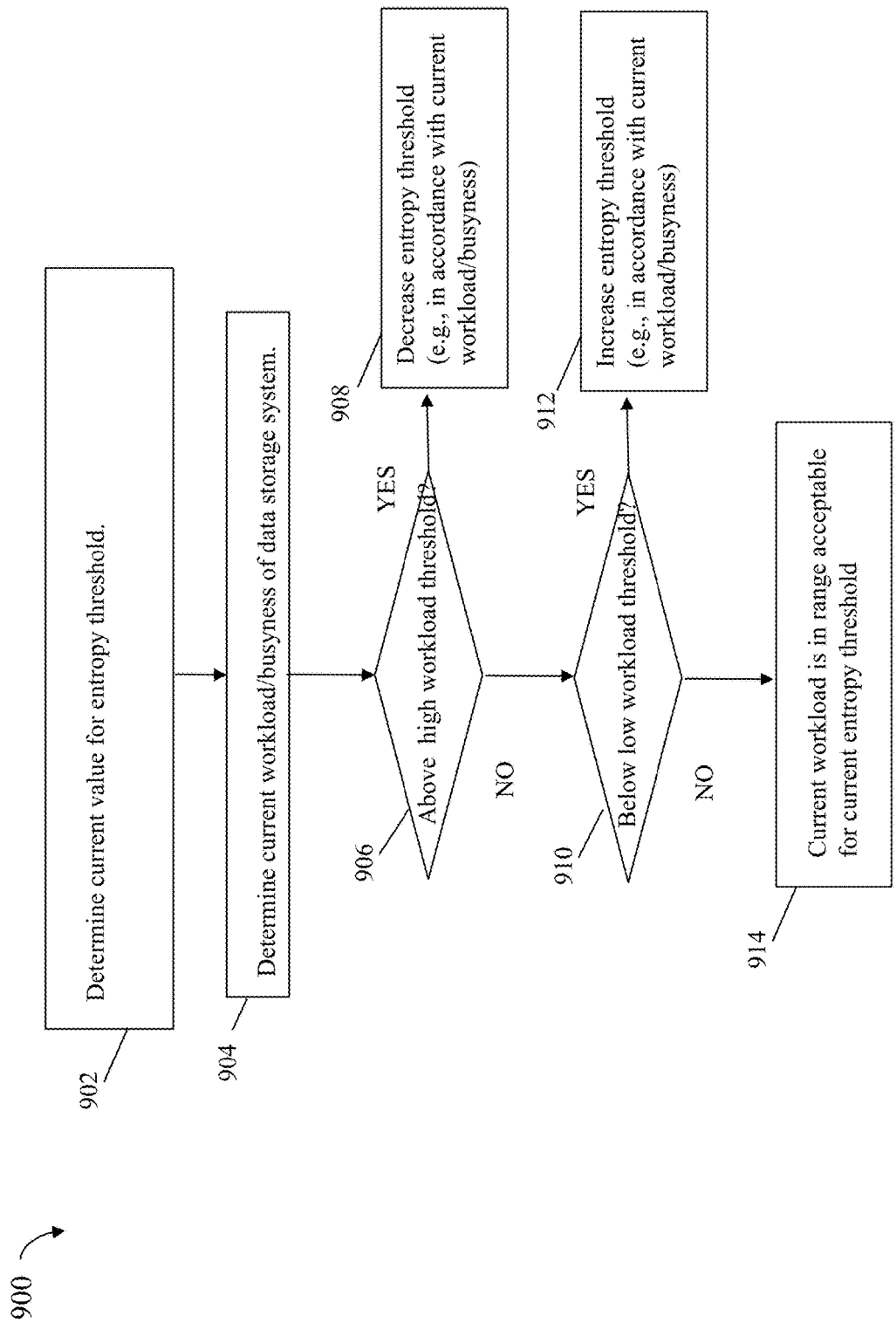

Referring to FIG. 10, shown is another flowchart 900 of processing steps that may be performed in an embodiment in accordance with techniques herein. The flowchart 900 summarized processing as described above in connection with adapting resources consumed in connection with ILC and compression based on the workload of the data storage system. At step 902, the current value for the entropy threshold is determined. From step 902, control proceeds to step 904 where the current workload or level of busyness of the data storage system is determined. From step 904, control proceeds to step 906 where a determination is made as to whether the current workload of the system is above a specified high workload threshold. If step 906 evaluates to yes, control proceeds to step 908 where processing is performed to decrease the entropy threshold in accordance with the current workload. If step 906 evaluates to no, control proceeds to step 910 where a determination is made as to whether the current workload of the system is below a low workload threshold. If step 910 evaluates to yes, control proceeds to step 912 to increase the entropy threshold in accordance with the current workload. If step 910 evaluates to no, control proceeds to step 914 where it is determined that the current workload is in the range acceptable for the current entropy threshold.

In connection with synchronizing processing of the threads or processing, such as described above in connection with examples herein, any suitable technique known in the art and any suitable available synchronization primitives or operations in an embodiment may be utilized to ensure that none of the threads executing in parallel performing processing of the same current data chunk are allowed to advance to perform processing for a different data chunk until all of the synchronized threads complete processing of the same current data chunk.

In this manner, an embodiment in accordance with techniques herein may perform concurrent processing on a same data chunk in a synchronized manner where processing (e.g., such as for multiple inline processing operations) of each single data chunk completes prior to commencing processing for a next data chunk. In this manner, techniques herein avoid loading a data chunk into cache, such as the CPU cache, more than once thereby improving system efficiency and performance.

Techniques described herein provide for an improvement over other approaches that may not perform data chunk synchronization whereby the same data chunk may be refetched and reloaded into the CPU cache multiple times. Described herein are various embodiments which perform data chunk synchronization of data processing operations that can may be performed concurrently.

The techniques herein may be performed by executing code which is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable.

While the invention has been disclosed in connection with embodiments shown and described in detail, their modifications and improvements thereon will become readily apparent to those skilled in the art. Accordingly, the spirit and scope of the present invention should be limited only by the following claims.

What is claimed is:

1. A method of performing data processing comprising:
performing, using a first processor, first processing that computes a data deduplication digest for a first data chunk;
performing, using a second processor, second processing that computes an entropy value for the first data chunk; and
synchronizing the first processing performed using the first processor and the second processing performed using the second processor with respect to the first data chunk, wherein said synchronizing ensures that both the first processing performed using the first processor and the second processing performed using the second processor have completed prior to proceeding with performing any of the first processing and the second processing on a second data chunk.

2. The method of claim 1, wherein the first processing and the second processing for the first data chunk are performed in parallel.

3. The method of claim 2, wherein one of the first processing and the second processing completes processing for the first data chunk prior to another one of the first processing and the second processing, and wherein said synchronizing does not allow the one of the first and second processing to proceed with processing the second data chunk until the another one of the first processing and the second processing has completed its processing for the first data chunk.

4. The method of claim 2, wherein the first data processing and the second data processing are performed inline as part of I/O path processing.

5. The method of claim 2, further comprising:
determining, using the data deduplication digest for a first data chunk, whether the first chunk can be deduplicated whereby the first chunk is a duplicate of an existing chunk currently associated with the data deduplication digest; and
responsive to determining that the first chunk can be deduplicated, deduplicating the first data chunk.

6. The method of claim 5, further comprising:
responsive to determining that the first chunk cannot be deduplicated, performing processing including:
determining whether the entropy value for the first data chunk is greater than an entropy threshold;
responsive to determining that the entropy value for the first data chunk is not greater than the entropy threshold, determining not to compress the first data chunk inline as part of the I/O path; and
responsive to determining that the entropy value for the first data chunk is equal to or less than the entropy threshold, compressing the first data chunk inline as part of the I/O path.

7. The method of claim 6, wherein the first data chunk is data of a write operation received at a data storage system and the method further comprises:
determining a current workload of the data storage system; and
modifying the entropy threshold in accordance with the current workload of the data storage system.

8. The method of claim 7, further comprising:
determining whether the current workload is above a high workload threshold; and
responsive to determining the current workload is above the high workload threshold, decreasing the entropy threshold in accordance with the current workload.

9. The method of claim 7, further comprising:
determining whether the current workload is less than a low workload threshold; and
responsive to determining the current workload is less than the low workload threshold, increasing the entropy threshold in accordance with the current workload.

10. The method of claim 1, wherein the entropy value for the first data chunk is determined using less than all data of the first data chunk.

11. The method of claim 10, wherein the entropy value for the first data chunk is determined using selected bytes of the first data chunk.

12. The method of claim 11, wherein the first data chunk is included in a data set having a data set entropy value and the entropy value for the first data chunk is determined as the data set entropy value.

13. The method of claim 12, wherein the data set includes a first plurality of data chunks and the method further comprising;
selecting a second plurality of data chunks of the data set, the second plurality being less than the first plurality of data chunks;
determining a plurality of entropy values for the second plurality of data chunks;
determining whether the plurality of entropy values are similar to one another; and
responsive to determining the plurality of entropy values are similar to one another, determining the data set entropy value in accordance with plurality of entropy values for the second number of data chunks of the data set.

14. A system comprising:
one or more processors; and
a memory comprising code stored thereon that, when executed, performs a method of performing data processing comprising:
performing first processing that computes a data deduplication digest for a first data chunk;
performing second processing that computes an entropy value for the first data chunk; and
synchronizing the first processing and the second processing with respect to the first data chunk, wherein said synchronizing ensures that both the first processing and the second processing have completed prior to proceeding with performing any of the first processing and the second processing on a second data chunk.

15. A computer readable medium comprising code stored thereon that, when executed, performs a method of performing data processing comprising:
performing first processing that computes a data deduplication digest for a first data chunk;
performing second processing that computes an entropy value for the first data chunk; and
synchronizing the first processing and the second processing with respect to the first data chunk, wherein said synchronizing ensures that both the first processing and the second processing have completed prior to proceeding with performing any of the first processing and the second processing on a second data chunk.

16. The computer readable medium of claim 15, wherein the first processing and the second processing for the first data chunk are performed in parallel.

17. The computer readable medium of claim 16, wherein one of the first processing and the second processing completes processing for the first data chunk prior to another one of the first processing and the second processing, and wherein said synchronizing does not allow the one of the first and second processing to proceed with processing the second data chunk until the another one of the first processing and the second processing has completed its processing for the first data chunk.

18. The computer readable medium of claim 16, wherein the first data processing and the second data processing are performed inline as part of I/O path processing.

19. The computer readable medium of claim 16, wherein the method further comprises:

determining, using the data deduplication digest for a first data chunk, whether the first chunk can be deduplicated whereby the first chunk is a duplicate of an existing chunk currently associated with the data deduplication digest; and responsive to determining that the first chunk can be deduplicated, deduplicating the first data chunk.

20. The computer readable medium of claim 19, wherein the method further comprises:

responsive to determining that the first chunk cannot be deduplicated, performing processing including:

determining whether the entropy value for the first data chunk is greater than an entropy threshold;

responsive to determining that the entropy value for the first data chunk is not greater than the entropy threshold, determining not to compress the first data chunk inline as part of the I/O path; and responsive to determining that the entropy value for the first data chunk is equal to or less than the entropy threshold, compressing the first data chunk inline as part of the I/O path.

\* \* \* \* \*